(12) United States Patent
Jitaru

(10) Patent No.: US 10,937,590 B2
(45) Date of Patent: Mar. 2, 2021

(54) MAGNETIC STRUCTURES FOR LOW LEAKAGE INDUCTANCE AND VERY HIGH EFFICIENCY

(71) Applicant: Rompower Technology Holdings, LLC, Milford, DE (US)

(72) Inventor: Ionel Jitaru, Tucson, AZ (US)

(73) Assignee: Rompower Technology Holdings, LLC, Milford, DE (US)

(*) Notice: Subject to any disclaimer, the term of this patent is extended or adjusted under 35 U.S.C. 154(b) by 0 days.

(21) Appl. No.: 16/368,186

(22) Filed: Mar. 28, 2019

(65) Prior Publication Data

US 2019/0221362 A1 Jul. 18, 2019

Related U.S. Application Data

(63) Continuation of application No. 14/660,901, filed on Mar. 17, 2015, now abandoned.

(60) Provisional application No. 61/955,640, filed on Mar. 19, 2014.

(51) Int. Cl.
| | |
|---|---|
| *H01F 27/40* | (2006.01) |
| *H01F 19/04* | (2006.01) |
| *G11C 11/06* | (2006.01) |
| *H01F 27/28* | (2006.01) |
| *H01F 27/29* | (2006.01) |

(52) U.S. Cl.
CPC ............. *H01F 27/40* (2013.01); *G11C 11/06* (2013.01); *H01F 19/04* (2013.01); *H01F 27/2804* (2013.01); *H01F 27/29* (2013.01); *H01F 2027/408* (2013.01)

(58) Field of Classification Search
USPC .......................... 336/105, 200, 232, 223, 184
See application file for complete search history.

(56) References Cited

U.S. PATENT DOCUMENTS

| | | | | |
|---|---|---|---|---|
| 5,168,440 A | * | 12/1992 | Spreen ................ | H01F 27/2847 336/226 |
| 2002/0113679 A1 | * | 8/2002 | Takayama ........... | H01F 27/2847 336/65 |
| 2010/0232181 A1 | * | 9/2010 | Nakahori ............ | H01F 27/2804 363/17 |
| 2010/0321960 A1 | * | 12/2010 | Nakahori ............ | H01F 27/2847 363/21.04 |

\* cited by examiner

*Primary Examiner* — Elvin G Enad
*Assistant Examiner* — Kazi S Hossain
(74) *Attorney, Agent, or Firm* — Thomas W. Galvani, P.C.; Thomas W. Galvani

(57) ABSTRACT

A magnetic configuration utilizing a plurality of posts and spiting the primary winding on each of the posts defining a core and placing the secondary windings together with the rectifier means around each post to minimise the stray and leakage inductance. A significant reduction of the core material and a reduction of the footprint is achieved due to better utilization of the winding material. The magnetic field is weaving from and through one post to the other to minimize the vertical component of ther field and forcing the magnetic field to be parallel with the winding to reduce the AC losses in copper of the winding. These properties allow the magnetic structure to be suitable in very high frequency applications and even in application with an air core. These magnetic structures can be used for implementing a transformer and for inductive applications.

8 Claims, 24 Drawing Sheets

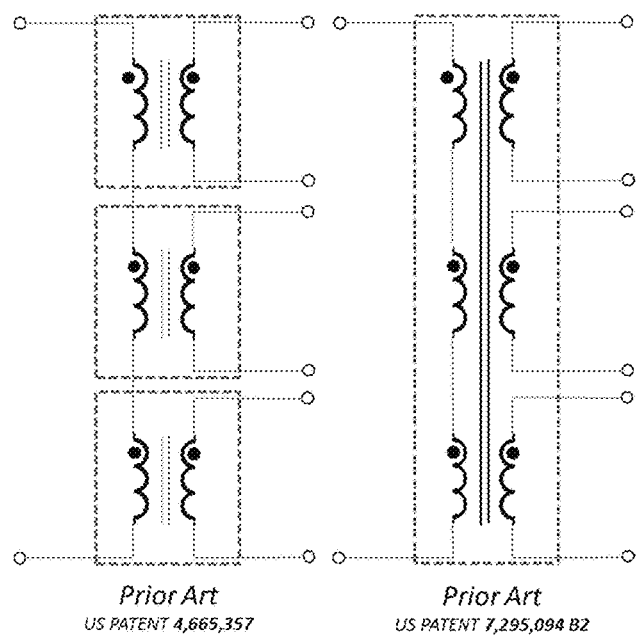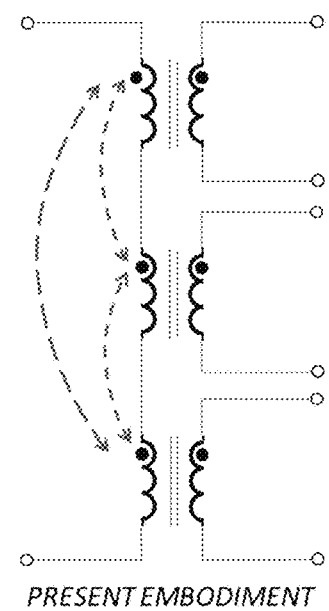
Prior Art
US PATENT 4,665,357
Prior Art
US PATENT 7,295,094 B2
PRESENT EMBODIMENT
FIGURE 1
FIGURE 2

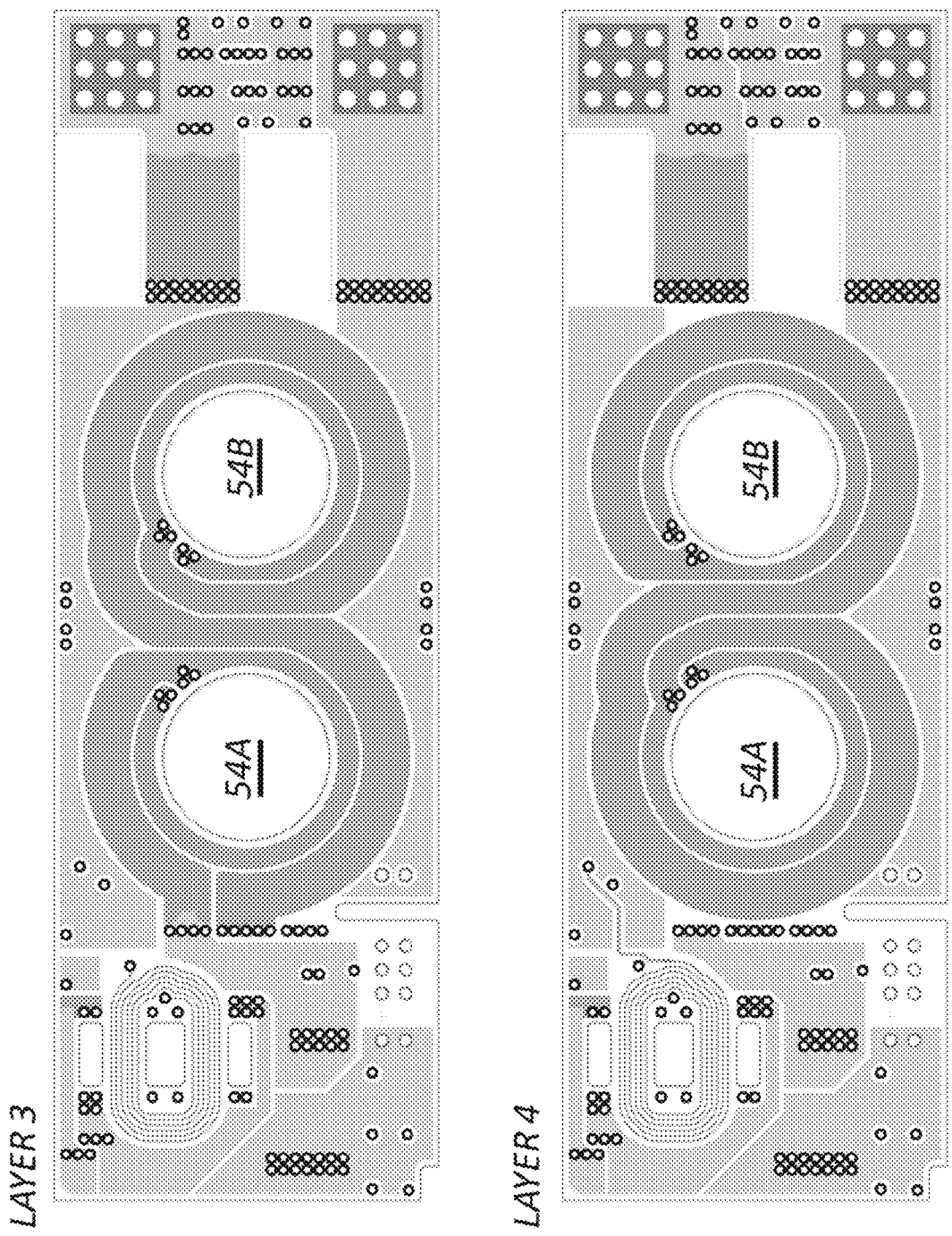

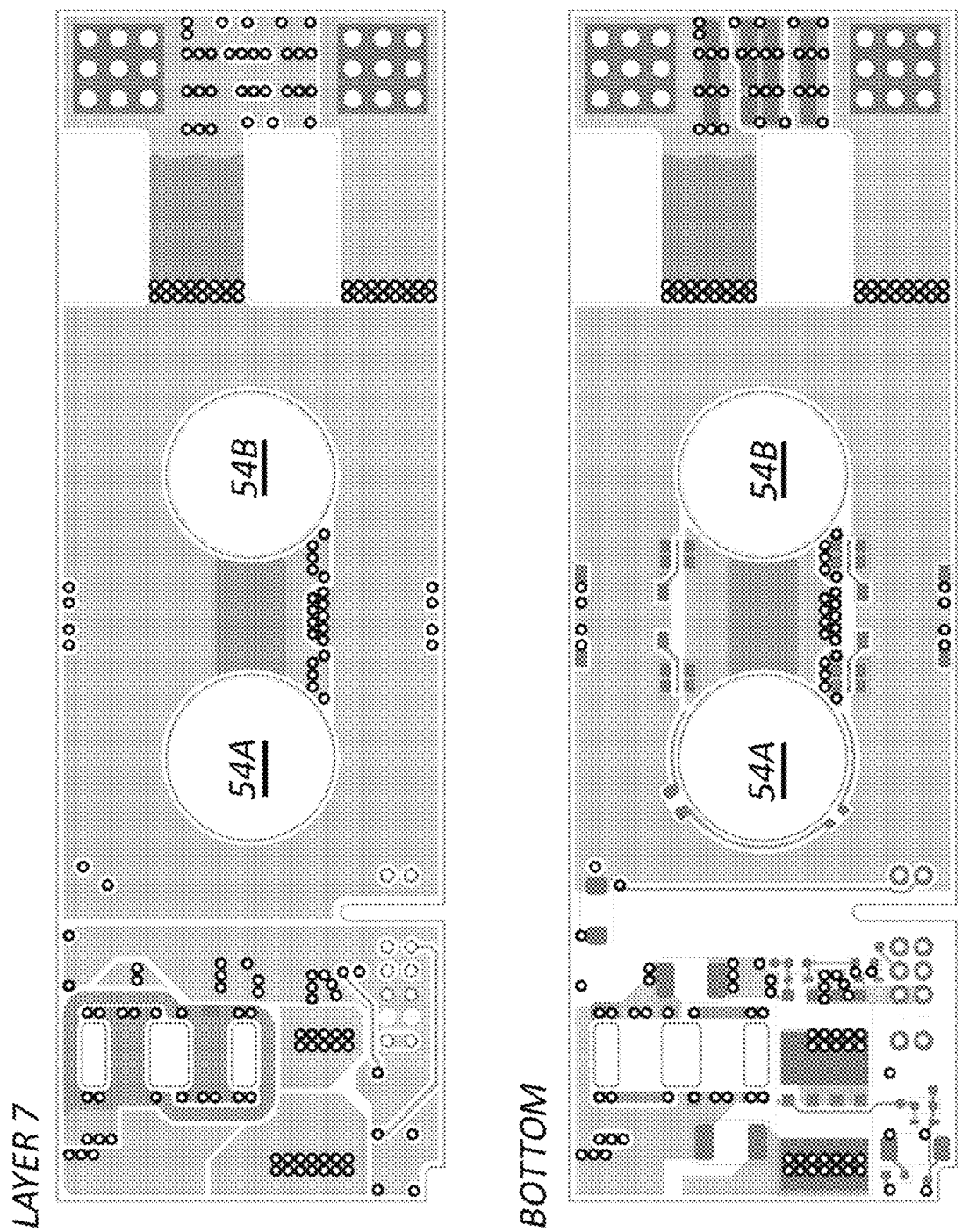

MAGNETIC STRUCTURES FOR LOW LEAKAGE INDUCTANCE AND VERY HIGH EFFICIENCY

CROSS-REFERENCE TO RELATED APPLICATIONS

This application is a continuation from U.S. patent application Ser. No. 14/660,901, filed on Mar. 17, 2015 and now published as US 2016/0307695, which in turn claims priority from the U.S. Provisional Patent Application No. 61/955,640, filed on Mar. 19, 2014. The disclosure of each of the above-identified applications is incorporated by reference herein.

TECHNICAL FIELD

The present invention relates mechanical construction and its mechanical results for transformer and inductances with utilization in power conversion, data transition and communication.

BACKGROUND

There is an industry demand for smaller size and lower profile power converters, which require smaller and lower profile magnetic elements, such as transformer and inductors. For a better consistency in production for magnetic elements, the windings are embedded into the multilayers PCB structures. In such applications, the copper thickness is limited. To be able to use thinner copper and limited numbers of layers for higher current applications, there are several solutions. One solution is to split the currents and process each section of it before is provided to the output. The progress in semiconductor industry wherein the footprint of some power devices became very small and the on resistance very small has also shifted the direction in the magnetic technology. The semiconductor devices are capable to process very high currents in a small footprint due to a significant reduction of the on resistance. This requires magnetic structures capable to handle very high current in a very small footprint. To reduce the power dissipation in the copper especially in the multilayer construction using very thin copper the length of the magnetic winding has to be reduced.

In FIG. 1 are presented two methods of splitting the current. One is described in U.S. Pat. No. 4,665,357 wherein there are employed multiple independent transformers with the primary in series, referred also as a Matrix transformer. Another methodology is described in U.S. Pat. No. 7,295,094 B2. The structure presented in U.S. Pat. No. 7,295,094B2 has several advantages over the structure presented in U.S. Pat. No. 4,665,357 such the increase of the total magnetizing inductance and a reduction of the magnetic core volume, though limited reduction because all the windings do share the same magnetic core.

In the patent application No. 61/821,896 filed May 10, 2013, and U.S. patent application No. 61/831,527 filed June 5, are presented soft switching topologies wherein the leakage inductance in the transformer has to be very small. The prior art magnetic structures depicted in FIG. 1 can provide some reduction of the leakage inductance but they cannot offer a significant reduction of the total footprint to allow a reduction of the stray inductance. The stray inductance adds to the leakage inductance and in some application can have a significant percentage of the total parasitic inductance. The latest GAN mosfet technology place another demand on the magnetic structures by pushing the operation frequency higher from hundreds of KHz to Megahertz level. Such high frequency magnetic structures are presented in IEEE Transactions on Power Electronics, Vol_28, NO 9, and September 2013, "A Technology Overview of the Power Chip Development Program". In these structures, magnetic cores are not used. The structures presented in previous mentioned publication there is a large Rac/Rdc ratio, which is the ratio of the total impedance of the winding including the high frequency losses such as proximity losses and skin effect losses divided by the DC only losses. In operation at higher frequency, that ratio plays an important role. In U.S. Pat. No. 5,381,124 is presented a low profile magnetic structure which employs a four legged magnetic core and as serpentine winding structure. Function of the winding configuration such a structure can benefit of a lower leakage inductance but it does not address the parasitic inductance, which is caused by the interconnection from the transformer to the power semiconductor devices. Another low profile magnetic implementation is described in the U.S. Pat. No. 7,187,263 B2. This is an optimized implementation of the Matrix transformer. In this implementation, the goal was not primarily to minimize the leakage inductance, which is a key element of the in power processing in the resonant topology. This implementation does reduce the stray inductance and the ac losses in the copper. It does not reduce the magnetic core total volume.

SUMMARY

The magnetic structures described in this invention provide an improved magnetic core configuration and winding arrangement. The magnetic structures described in this invention do offer a much lower leakage inductance, a better utilization of the copper a smaller footprint and in some implementations are very suitable for air core magnetics for very high frequency operation. The embodiments of this invention can be used for transformer application or inductive elements.

In one of the basic aspects of the present invention, a magnetic circuit element includes a circuit board, a plurality in excess of two magnetic flux conducting posts penetrating through the circuit board, at least two magnetic flux conducting plates connecting on both sides of the magnetic flux conductive posts, at least two connected primary winding encircling the magnetic posts, and at least two connected secondary winding encircling the magnetic posts.

In this aspect of the invention, power components are placed in series or in parallel with the winding and become part of the primary or secondary winding. In addition, the entire magnetic structure can be encircled by a suitable shaped, magnetic flux conductive device and interconnections pins are placed inside and outside of the encircling the suitable shaped magnetic flux conductive device, where the pins are connected to a motherboard. Also, the flux conducting plates, or the flux conducting plates and magnetic flux conductive posts can be removed.

In another basic aspect of the present invention, a magnetic circuit element with center tap topology is provided, including a circuit board, a plurality of magnetic flux conducting posts penetrating through the circuit board, magnetic flux conducting plates connecting on both sides the magnetic flux conductive posts, primary windings encircling the magnetic posts, and secondary windings encircling the magnetic posts, wherein the center tap topology is configured to allow reuse of at least portions of both the primary and secondary windings for current flow in either direction.

In one of the embodiments of this invention, which is described in FIG. 3A, and FIG. 3B there is a better copper optimization in the center tap topology. In center tap topology the secondary winding is not utilized properly. During one polarity the current flow through one of the secondary winding while, the other part of the secondary is not conducting. In one of the embodiments of this invention, the current in the secondary winding of the transformer circulates in both polarity in the center tap topology leading to a better copper utilization and lower power dissipation. Only a portion of the secondary winding is used for unidirectional current flow. The flooding with the copper over the primary winding will allow current flow freely to cancel the magnetic field of the primary winding to reduce the leakage inductance. Such implementation is presented in FIGS. 6A, 6B, 6C, 6D. In these figures, the copper surrounds the area penetration of the magnetic core. The current flows through the copper around the cores in order to cancel the magnetic field produced by the primary winding. Such a magnetic configuration using a U-shaped core, and using the copper structures as presented in the drawing have a very low leakage inductance.

In key one embodiment is depicted in FIG. 5A, FIG. 5B and FIG. 5C. This magnetic structure has four posts, which penetrates through the multilayer structure wherein the windings are embedded. This structure is the result of merging four E type magnetic cores, and in the process, a good portion of the magnetic core material is eliminated. That reduces the total footprint of the magnetic structure and reduces to total core loss, which is proportional with the volume of the core material. In this process the secondary winding merge as well as depicted in FIG. 5B. Each equivalent E shaped core is presented in FIG. 5C. Though the magnetic core with four legs are depicted in other prior art, the copper structures and the placement of the rectifier means changes the mode of operation and the performances.

In another embodiment depicted in FIGS. 9A and 9B is presented the same four-legged magnetic structure wherein the output current flows out of the four openings and under the magnetic rectangular plate with a cutout in the middle to accommodate the four-legged transformer, which represents the output inductor. By placing the output connectors as depicted, the current is split and the magnetic core of the output choke does not have to penetrate the multilayer structure. In this way, we increase the utilization of the copper and decrease the total footprint of the transformer and output choke. This embodiment is very suitable for high output current applications.

The magnetic configurations using the center posts can be implemented in different configuration as is presented in FIG. 12, FIG. 13 and FIG. 14.

FIG. 10 depicts a more details drawing of the four-legged magnetic structure employing two magnetic core structures and a multilayer PCB. In FIG. 11, the center cutouts in the plates 111 and 113 are eliminated for technological reasons, though there is not a magnetic flux flowing through that section.

In FIG. 14 is presented a low profile magnetic structure employing a multitude of center posts. This magnetic structure can be a transformer structure or an inductive structure. On advantage using this configuration as a storage element is the fact that the gap will be distributed among all the center posts.

The magnetic plate can be removed an in that case we can have only the center posts as in FIG. 15 or air core as depicted in FIG. 16. There is a possibility to have just the center posts with a small plate at one end of it, or both, leaving a gap between the plates. In FIG. 17 the ac to dc ratio, it is very low for an air core and this magnetic structure is highly suitable for very high frequency applications.

BRIEF DESCRIPTION OF THE DRAWINGS

FIG. 1: Shows prior art distributed magnetic structures using a multitude of the magnetic elements wherein the primaries are placed in series.

FIG. 2: Shows our equivalent schematic of the preferred embodiment wherein the magnetic elements are coupled.

FIG. 6A through 6D shows the metal etch layers comprising winding in the transformer using the U core implementation described in FIGS. 3A and 3B.

DETAILED DESCRIPTION

Figure 3A:
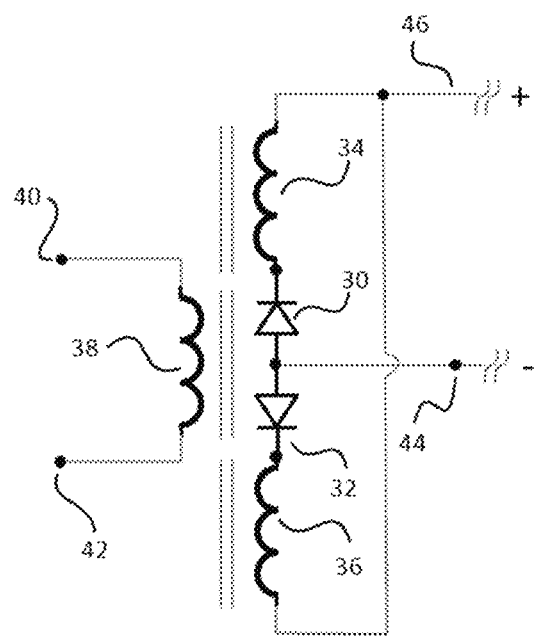
FIG. 3A: Depicts a transformer, employing center tap including the rectifiers.
Figure 3B:
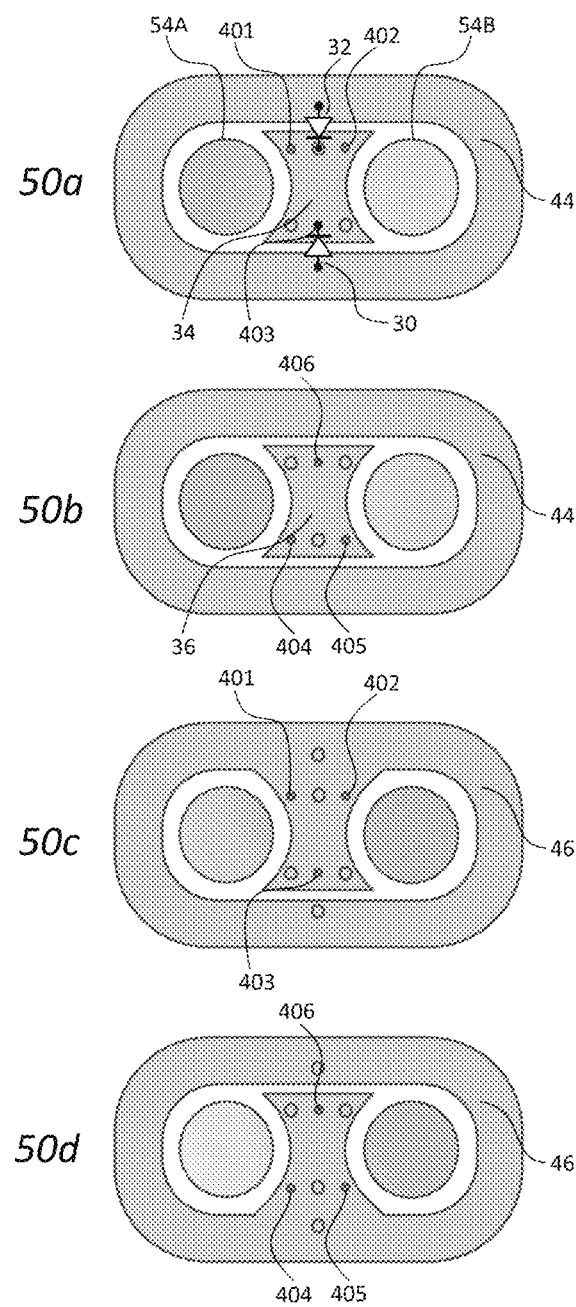
FIG. 3B: Shows the secondary winding implementation of the transformer presented in FIG. 3A. The secondary winding implementation, in a transformer structure using a U core is one of the embodiments of this invention, wherein the copper utilization of the secondary windings is significantly improved over conventional center tap implementation.

Presented in FIG. 3A is a center tap transformer structure having a primary winding 38, and two identical secondary windings 34 and 36. In the secondary side, there are two rectifier means, 30 and 32. The secondary rectifier means can be Schottky diodes, synchronous rectifier using silicon power Mosfets, GANs or other technologies. There is a positive output 46, and a negative output 44. Typically, the negative output it might be connected to the output ground. In the primary, an AC signal is applied to the primary winding between 40 and 42, which can be generated, by a full bridge configuration, half bridge or other topologies. In one of the polarities generated by the signal applied to the primary winding 38, one of the rectifiers means conducts and when the polarity changes the other rectifier means will conduct. Because only one of the secondary winding is conducting current during each polarity the copper in the secondary is not fully utilized. This is one of the major disadvantages of the center tap topology. In addition to that, in center tap topologies there is a leakage inductance between the two secondary windings, which will delay the current flow from a winding to another. In the present embodiment described in FIG. 3B these two drawbacks associated with center tap are minimized. In FIG. 3B are presented four layers of a multilayer structure, from 50a through 50d, wherein the secondary winding is implemented. A U core shape magnetic core penetrates through the multilayer PCB through the cutout 54A and 54B. In between the legs of the magnetic core there is a conductive material, usually copper connected to the cathodes of the rectifier means, one on layer 50A connected to the cathode of 30 and another one placed on layer 50b connected to the rectifier means 32. On layer 50c and 50d there, the cutouts 54A and 54B are surrounded by conductive material, which is connected to 46. On layer 50a and 50 b there is a ring of conductive material, which is connected to the anode of the rectifier, means 44.

During one of the polarities when the rectifier means 30 conducts the current flows through the conductive material between the legs of the U core from the anode connected to 44 and through the rectifier means, 30, and further through the vias 401 and 402 on layer 50c to the 46. Another path for current flow is through the rectifier means 30 and via 403 and further towards 46. During the polarity wherein rectifier means 32 is conducting, the current will flow from 44, through 32, and further on layer 50b through the conductive material, 36, placed between the cutouts, 54A and 54B, and further through via 404 and 405 to layer 50d towards 46. Another path for the current flowing through 32 is through via 406 to layer 50d and through the conductive material in between the cutouts 54A and 54B towards 46. Though one turn secondary for this magnetic structure will circle the 54A and 54B, the portion of the secondary wherein the current is flowing in only one direction is reduced the conductive material between the cutouts, 54A and 54B, such as 34 and 36. For the rest of the one turn secondary such as the portion of 44 and 46, which surrounds the cutouts 54A, and 54B the current is flowing in both directions. This means that the copper utilization it improved by comparison with more traditional winding technique wherein the entire secondary winding is conducting during only during one polarity.

Another advantage of the winding structure presented in FIG. 3B is the fact that the copper is placed over the entire section of the primary windings allowing the current to flow in order to cancel the magnetic field produced by the primary winding. In addition to that, the rectifier means 32 and 30 are placed as the part of the secondary winding eliminating the end effect losses and reducing the stray inductance.

Figure 4A:
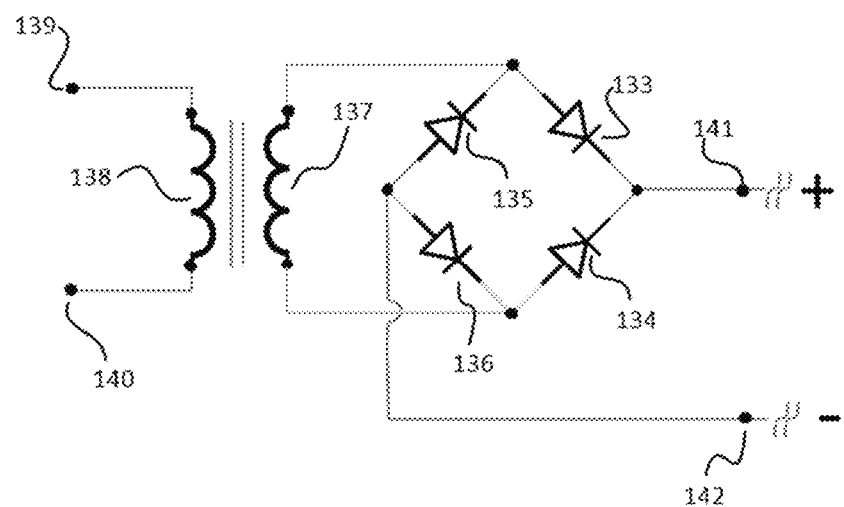
FIG. 4A: Shows a transformer structure without the center tap using a full bridge rectification.
Figure 4B:
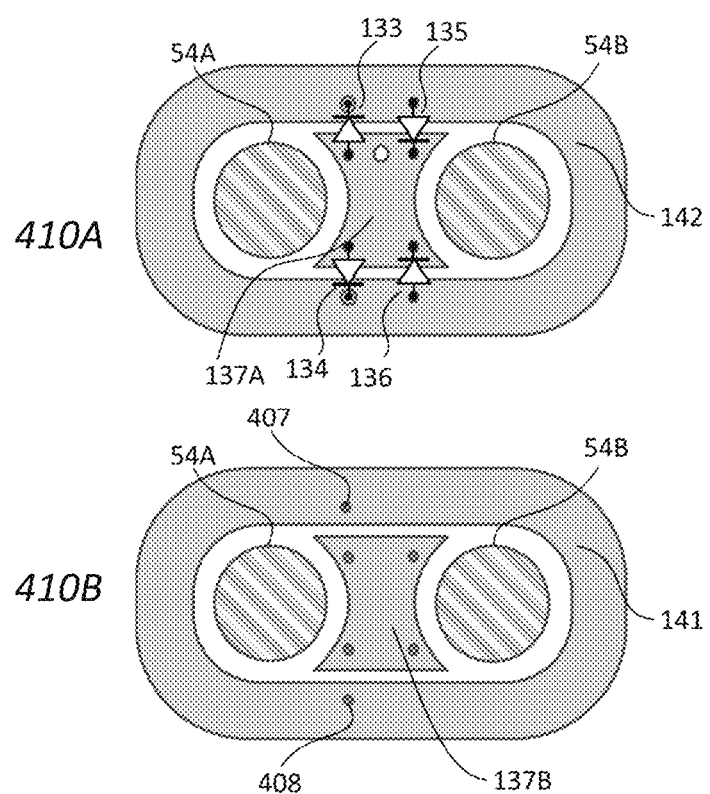
FIG. 4B: Shows the secondary winding implementation of the transformer presented in FIG. 4A.

In Figure, 4A is presented a transformer structure using full bridge rectification. It is composed by a primary winding 138, a secondary winding 137, four rectifier means 133,135, 134, and 135. The rectified voltage is connected to 141 and 142. The primary winding terminations 139 and 140 are connected to an AC source, which can be generated, by a full bridge, half bridge or any other topologies. In FIG. 4B is presented the secondary winding arrangement for one turn secondary. For one of the polarities the current is flowing through 136, the copper section, 137A and 137B placed in between the cutouts 54A and 54B, and further through 133, through the via 407 to the layer 410B towards 141. During the other polarities the current will flow from 142, through 135 and further through the copper section, 137A and 137B placed between the cutouts 54A and 54B, and further through rectifier means 134 and through via 408 to the layer 410B, towards 141. In this topology the secondary copper utilization, it is inherently very good because the secondary winding 137 does conduct during both polarities. The winding structure presented in FIG. 4B however does incorporate the rectifier means, 133,136,134 and 135 as part of the secondary winding eliminating the end effects and reducing the stray inductance.

Figure 5A:
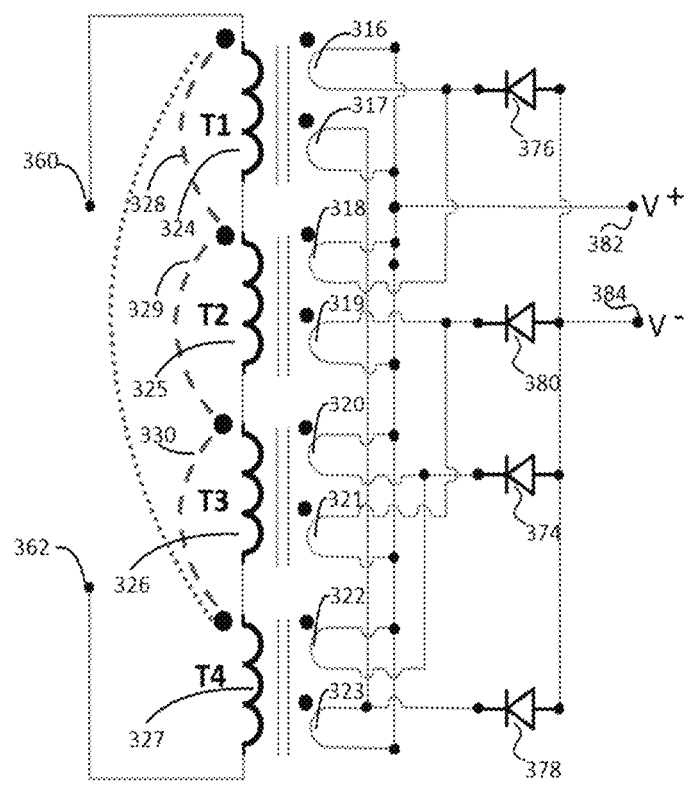
FIG. 5A: Shows the equivalent schematic of the four-legged magnetic structure with center tap.

In FIG. 5A is presented the equivalent circuit of one embodiment of this invention wherein a four legged magnetic core structure is used. There are four transformers T1, T2, T3 and T4, which are coupled to each other in series. The T1 is coupled with T2, T2 is coupled with T3 and T3 is coupled with T4 and further T4 is coupled with T1. In FIG. 5C is presented the definition of each transformer from T1 to T4. Each transformer is represented as an E core transformer having as a center post the entire cylindrical leg and two outer posts, which are half of the cylindrical legs in its direct vicinity. The shape of the four legs however can be rectangular or any other shape. Because the transformers T1, T2, T3 and T4 doe share sections of the same cylindrical posts, there is a coupling between them.

Figure 5B:
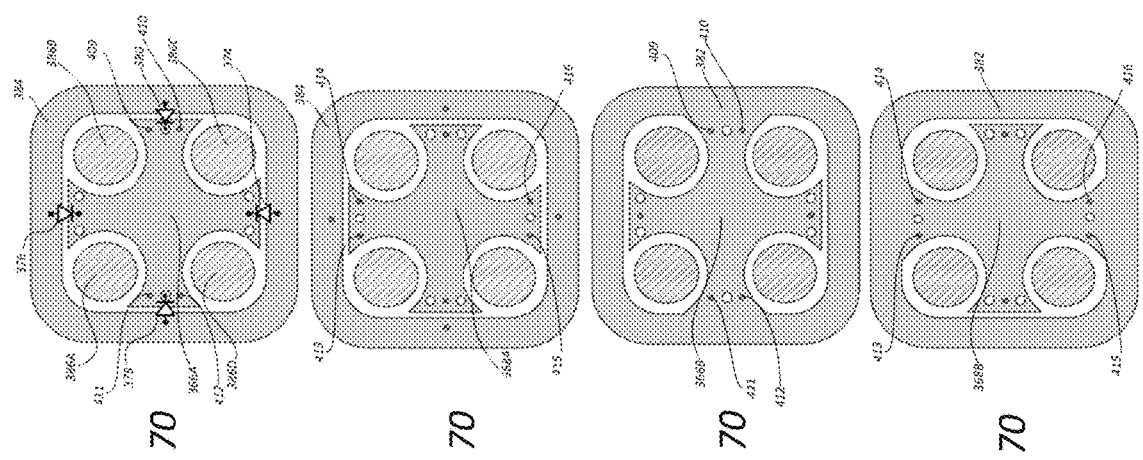
FIG. 5B: Shows the secondary winding implementation of the four-legged transformer presented in FIG. 5A.
Figure 5C:
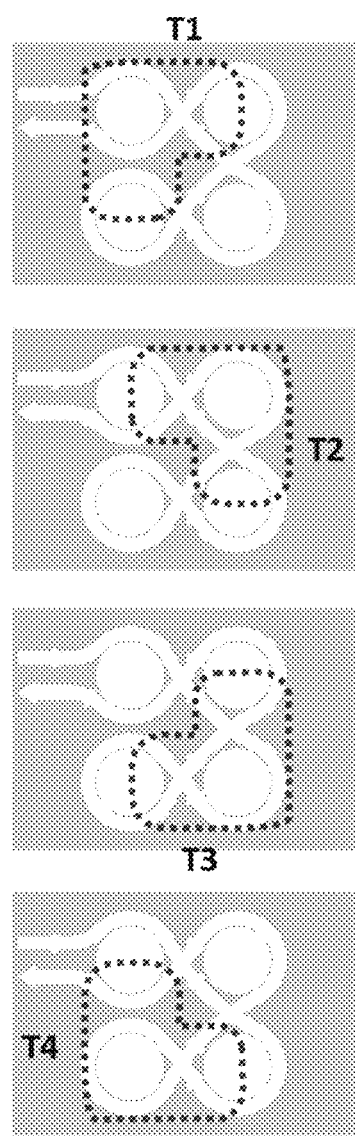
FIG. 5C: Shows the equivalent four transformers that are part of the four-legged transformer.

The equivalent schematic of the magnetic structure implemented in FIG. 5B is presented in FIG. 5A. An AC signal is applied between 360 and 362, which can be generated by a full bridge, a half bridge structure, or any other double-ended topology. When a signal with positive polarity at 360 versus 362 is applied the rectifier 376 and 374 are activated and the current flows from the negative voltage V−, 384, which in many application is connected to the ground, further through the copper section shaped as a cross, 366A, located on the layer 70a, towards the via connection 411, 412 and 409, 410. Through the via 411, 412 and 409, 410 the current flows further on the layer 70C towards the 382. A parallel path for the current during this polarity is through the rectifier means 376 and 374, on the layer 70C further through 366B towards 382. During the other polarity the other rectifier means 380 and 378 are activated and the current will flow further on layer 70b through the copper section shaped as a cross 368A towards via 413, 414 and 415, 416 and further to the layer 70d towards 382. Another path for the current flowing through 378 and 380 is through 368B on layer 70d towards 382.

The current flowing through 384,382, which surrender the four-lagged magnetic structure, and through 366A, 368B, 366B and 368B is aimed to cancel the magnetic field produced by the primary winding. The fact that the primary winding is split in four sections surrounding the four lagged magnetic core legs 115A, 115B, 115C and 115D from FIG. 10, and on each leg we have current flow into the secondary to suppress the magnetic field created by the primary winding, the leakage inductance in the magnetic structure presented in this patent application, it is very low. The copper arrangement depicted in FIG. 5B does allow a very low impedance current flow and in addition to this the rectifier means 376,380,374 and 378 are part of the secondary winding eliminating in this way the end effects and the stray inductance. The end effect is characterized by the ac losses in the copper after the secondary winding leaves the transformer to make the connection to the secondary means. In this embodiment, there are no end effects because the secondary winding does not leave the magnetic structure, each rectifier means being part of the secondary winding.

Figure 10:
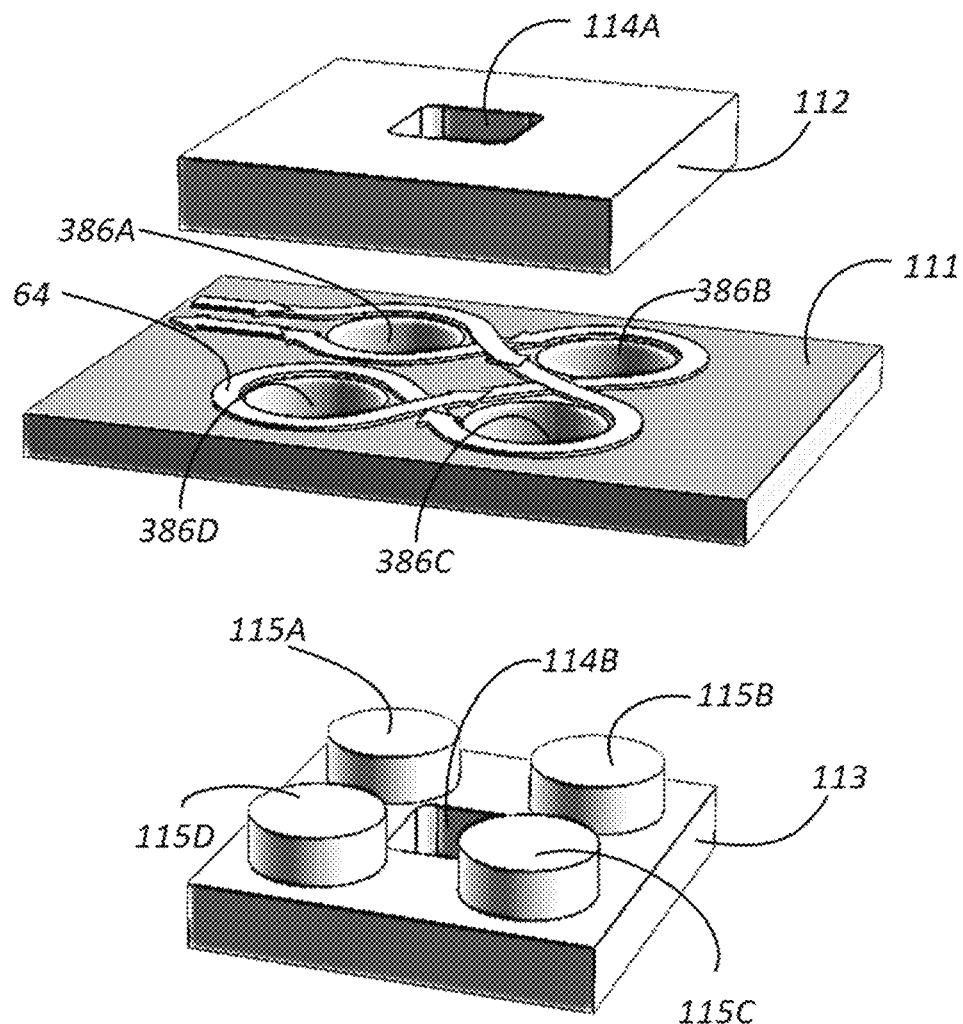
FIG. 10: Shows three-dimensional drawing of the four-legged magnetic structure.

The magnetic structure depicted in FIG. 5B does have several advantages over the conventional magnetic using an E core and even U shape cores. First of all the leakage inductance is significantly reduced. In addition to this, the ac losses in the windings are further reduced because the magnetic field intensity between primary and secondary is four times reduced by comparison to one magnetic core structure. In addition to this, the core volume of this configuration is it smaller than smaller than one core configuration. The placement of the rectifier means as a part of the secondary ending eliminated the end effects and the stray inductance between the secondary winding and the rectifier means. The coupling between the four equivalent transformers as depicted in FIG. 5A reduces the thickness of the ferrite plates 112 and 113, which are placed on top of the four cylindrical legs 115A, 115B, 115C and 115D as depicted in FIG. 10.

Figure 6A:
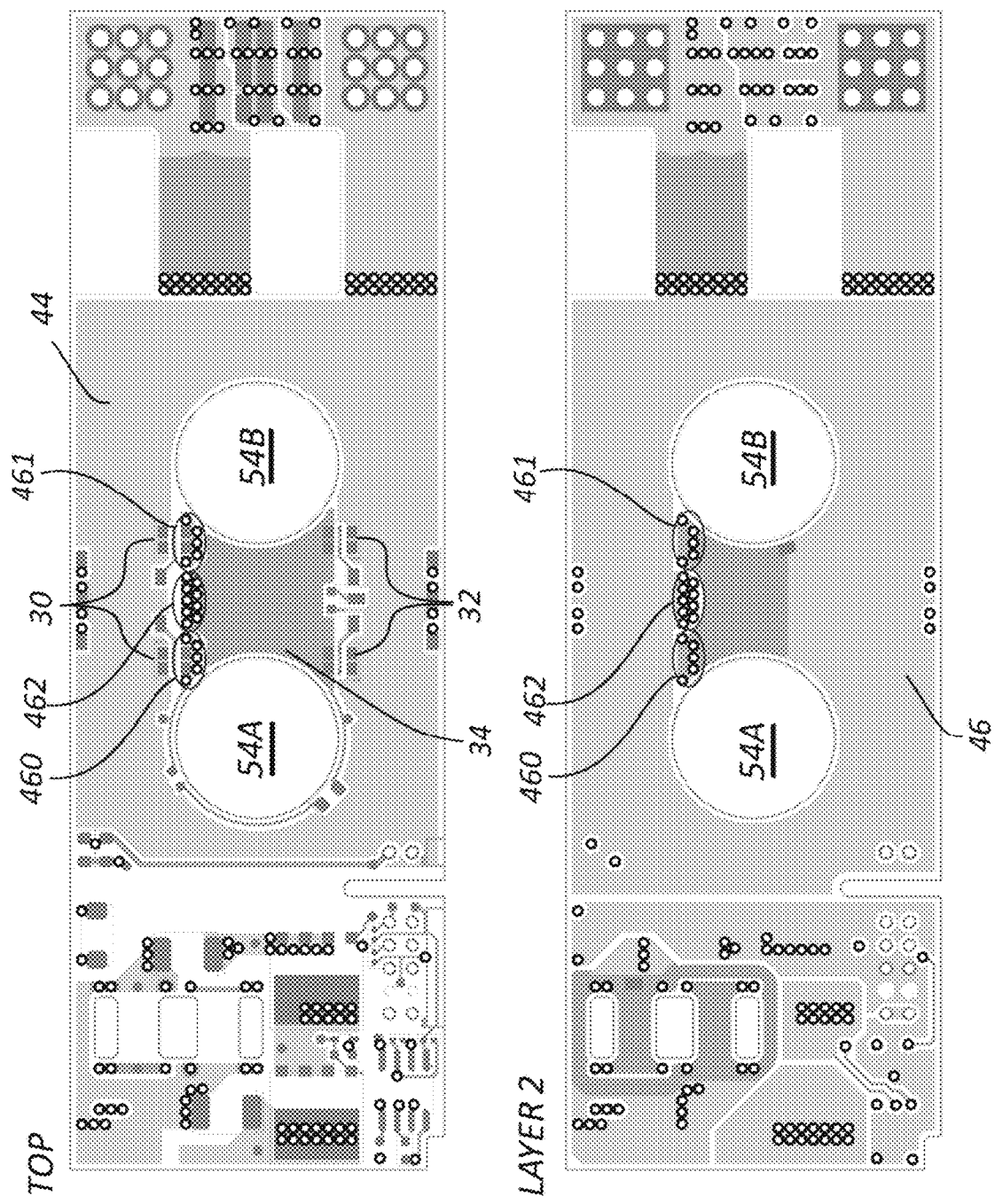
Figure 6C:
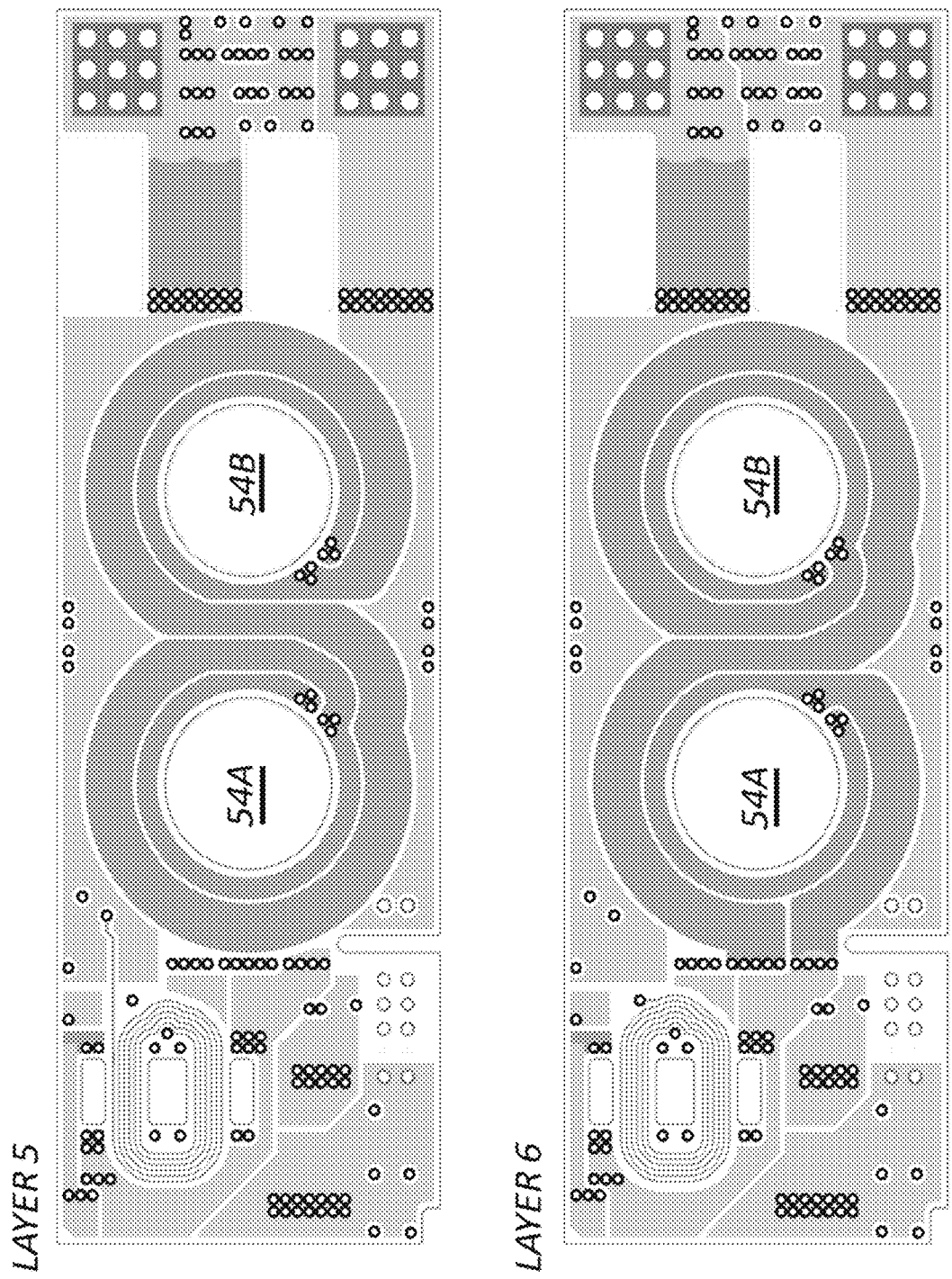

In FIG. 6A through 6D are presented metal etch layers comprising windings for the transformer structure presented in FIG. 3A. The winding implementation of FIG. 6A through 6D is optimized in respect of layers utilization for the purpose of industrialization. In FIG. 3B we are using four layers while in FIG. 6A we are using just two layers. In FIG. 6A is presented the top layer and layer 2. On the top layer the cutouts for the magnetic core, 54A and 54B are surrender by a copper connected to ground which is FIG. 3A is labeled 44. On the layer 2, the cutouts for the magnetic core, 54A and 54B are surrender by copper connected to 46, as per FIG. 3A. The rectifier means 30 and 32 from FIG. 3A are implemented by using two synchronous rectifiers in parallel. The copper section, 34, placed between the cutouts 54A and 54B, is connected to the group of via 462. The drain of the rectifier means 30 is placed on two pads connected to the group of via 460 and 461. During the polarity wherein the rectifier means 32 are conducting the current is flowing from 44 through the rectifier means 32 further through 34 and through the via 462 to the layer 2 where the current flows to 46. During the polarity wherein the rectifier means 30 are conducting the current is flowing from 44 through the rectifier means 30 further through 460 and 461 to layer 2 and further through the copper placed between the cutouts, 54A and 54B, towards 46. On FIG. 6B, 6C are presented the primary windings, which are incorporated in layer 3, 4, 5 and 6. In FIG. 6D is presented the secondary winding together with the rectifier meas. These layers are identical to the layer 1, the top, and layer 2. However, on these layers, the winding configuration is placed in a mirror arrangement. The massive copper arrangement around the magnetic core legs allows the current to flow optimally and choose its own path in order to cancel the magnetic field produced by the primary winding. This helps in further reducing the leakage inductance in the transformer structure.

Figure 7A:
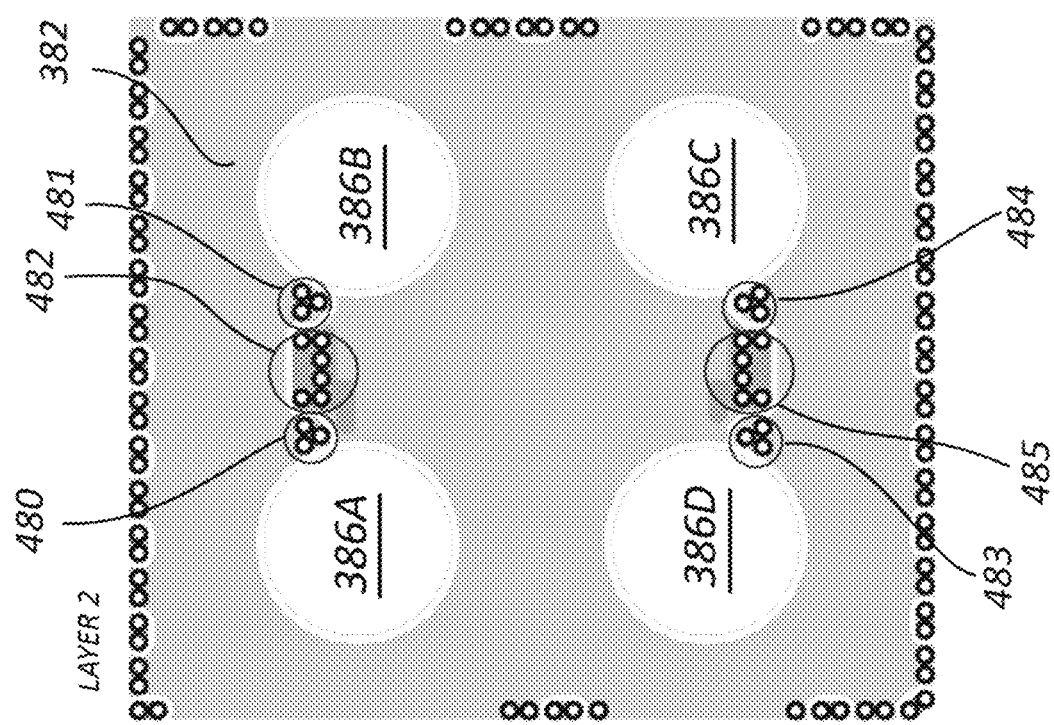
FIGS. 7A and 7B: Shows the metal etch comprising winding for the four-legged magnetic structure described in FIGS. 5A and 5B.
Figure 7A:
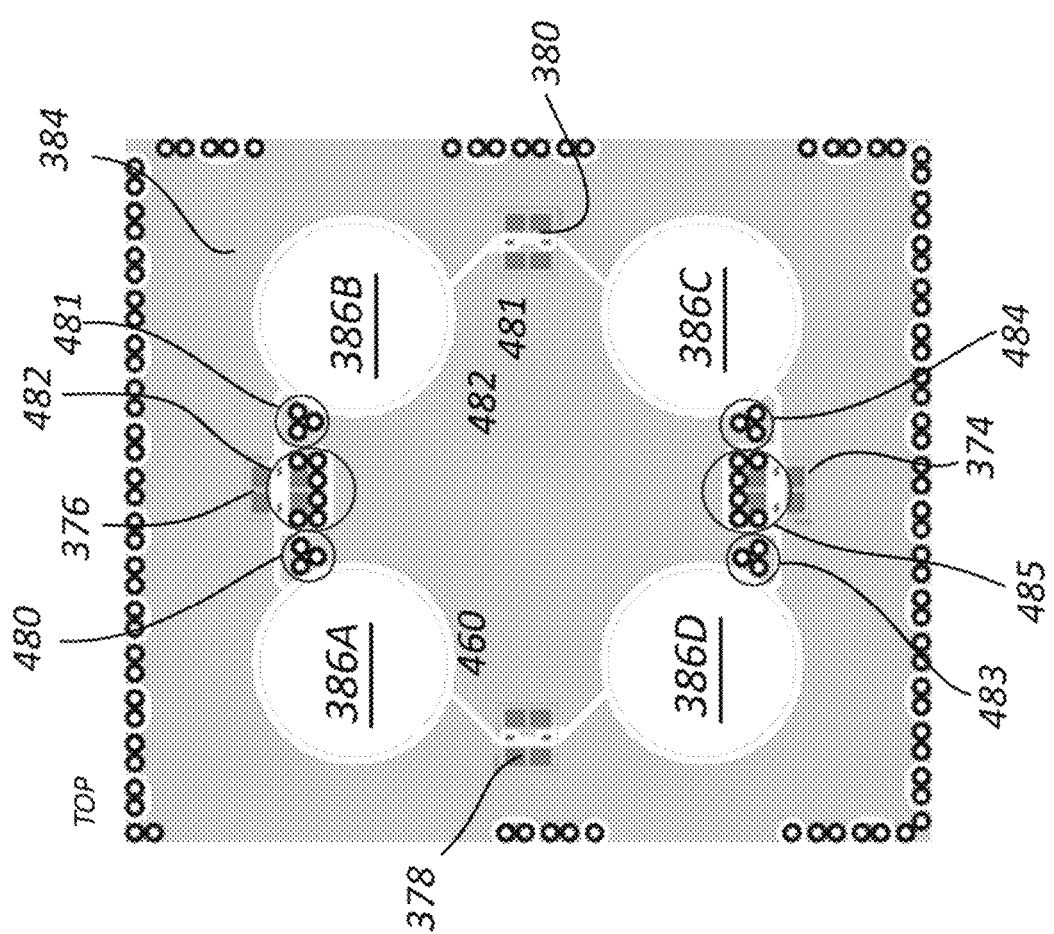

In FIG. 7 is presented an optimized implementation of the magnetic structure of FIG. 5B. In FIG. 7A the four legged magnetic structure is using just two layers for the secondary winding unlike four layers as depicted in FIG. 5B. This implementation is for industrialization wherein the cost effectiveness is very important.

For one of the polarities of the voltage applied to the primary transformer between 360 and 362, FIG. 5A, the rectifier means 376 and 374 conducts and the current will flow from 384 through 376,374 through the via 482 and 485 to the second layer. On the second layer, the current will continue to flow in both directions, one between the cutouts 386A and 386D and between cutouts 386B and 386C towards V+, 382. During the opposite polarity the current will flow from 384 through rectifier means 380 and 378 towards the via 480,481 and respectively 483 and 484, to the layer 2 and further to V+, 382.

Figure 7B:
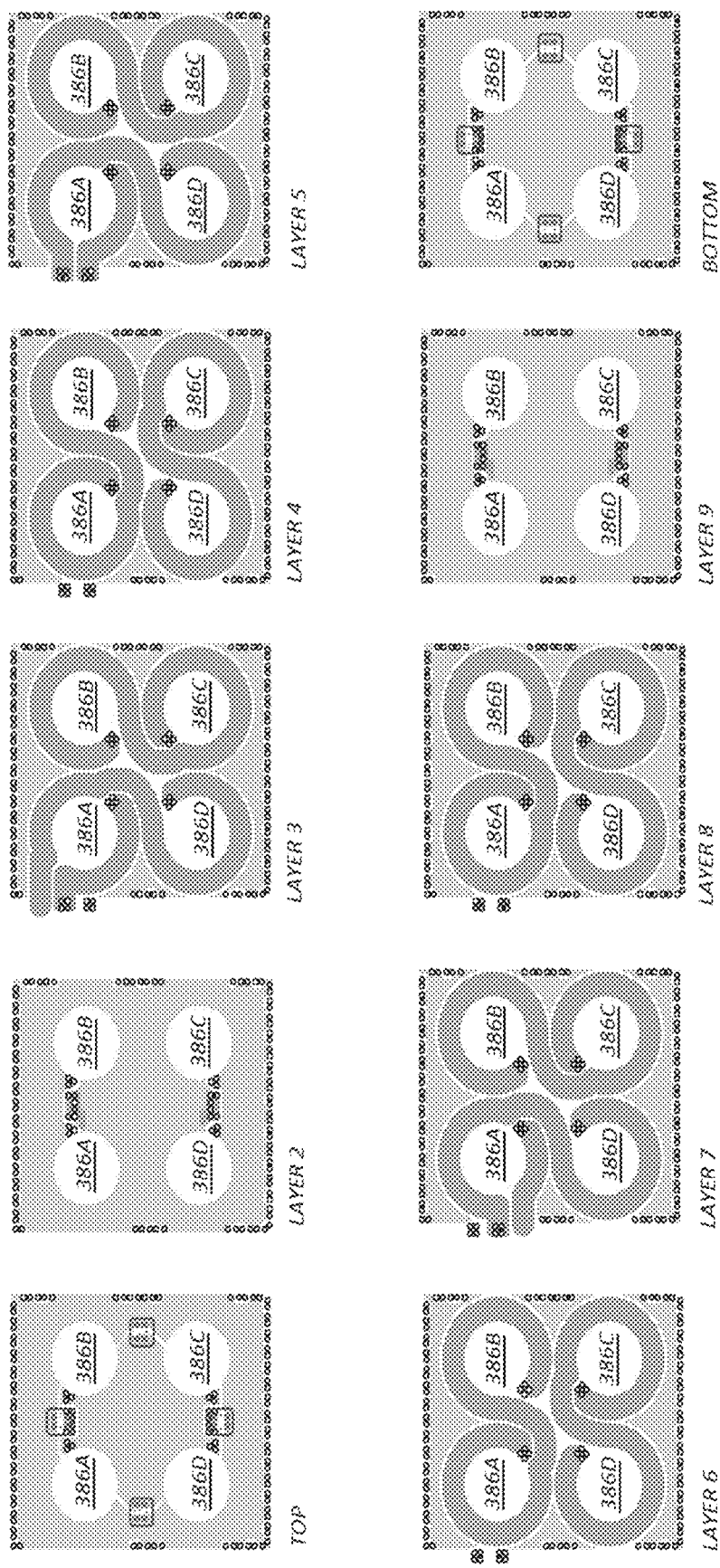

The implementation of the secondary winding depicted in FIG. 7A has the advantage of using just two layers. In FIG. 7B is presented all the layers, starting with to top two layers incorporated secondary winding and the bottom two layers, layer 9 and layer 10 wherein secondary windings are also implemented. The layer 1 and layer 2 and layers 9 and 10 are mirror imagine to each other. The primary windings are implemented on layers 3,4,5,6,7 and 8.

Figure 8A:
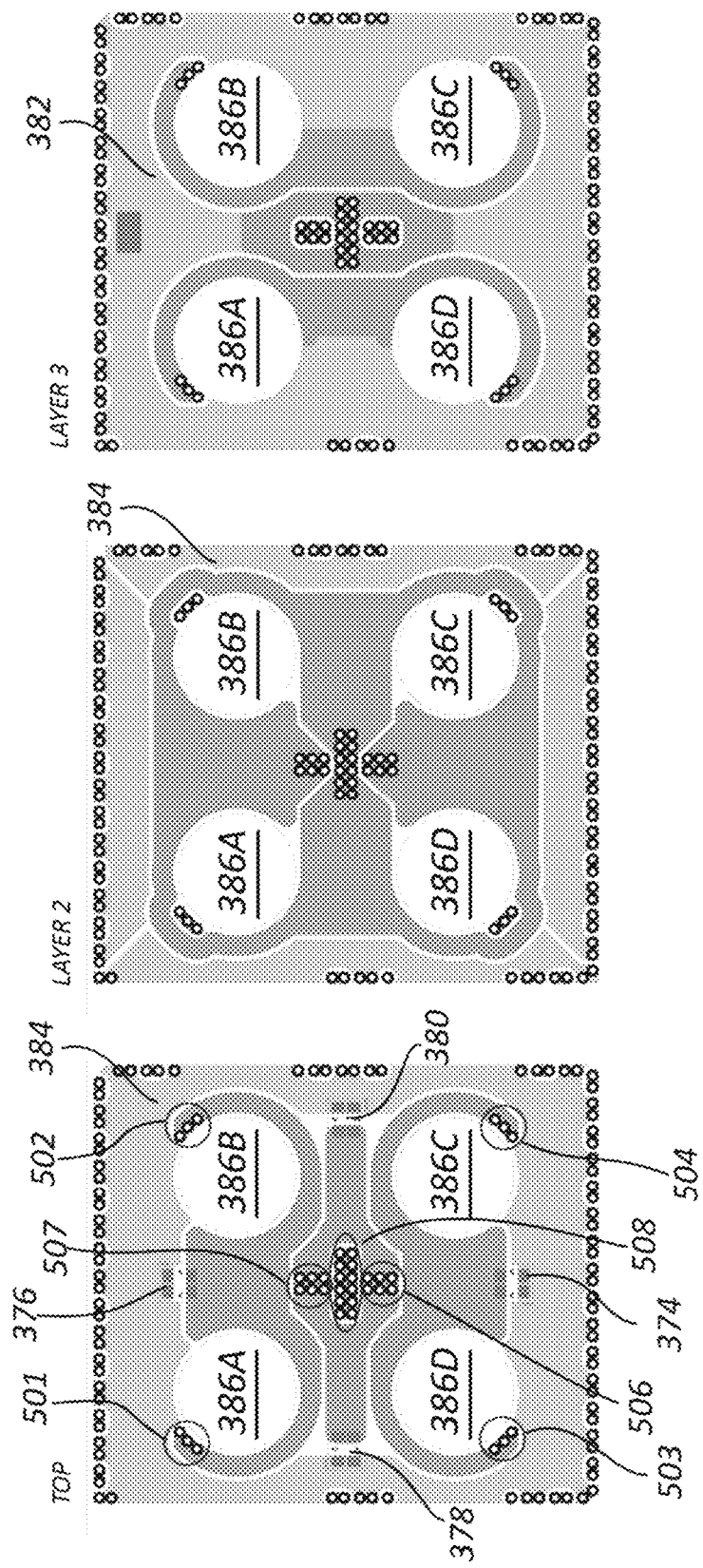
FIGS. 8A and 8B: Show the metal etch comprising winding for the four-legged magnetic structure having two turns secondary winding.

In FIG. 8A is presented one of the embodiments of the four-legged magnetic structure wherein we have two turns in the secondary winding. During one of the voltage polarity injected between 360 and 362 the rectifier means 376 and 374 conduct and the current will flow from 384 through 376, 374 and further around the magnetic core cutout 386A, 386B and respectively 386C and 386D towards via 501,502 and respectively 503,504 further on the layer 3 where will flow towards V+, 382.

During the voltage polarity applied between 360 and 362 when the rectifier means 380 and 378 are conducting the current will flow from 384, through 380 and 378 and further through via 506 and 507 on layer 2 and further through via 508 on layer 3 towards 382.

Figure 8B:
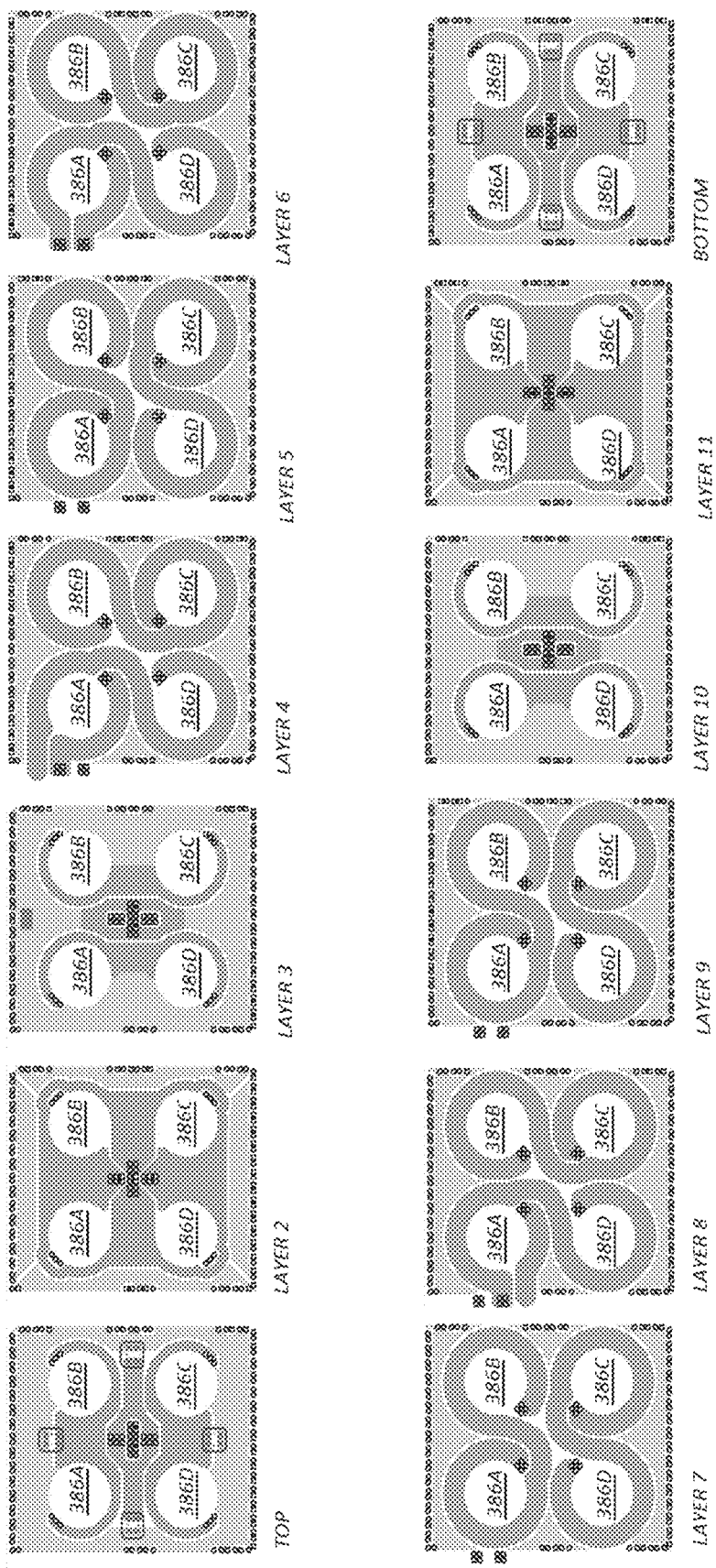

In FIG. 8B presented is the 12-layer-winding structure, in which the primary windings are implemented in six of the inner layers and the secondary windings are implemented in the top and bottom three layers.

Figure 9A:
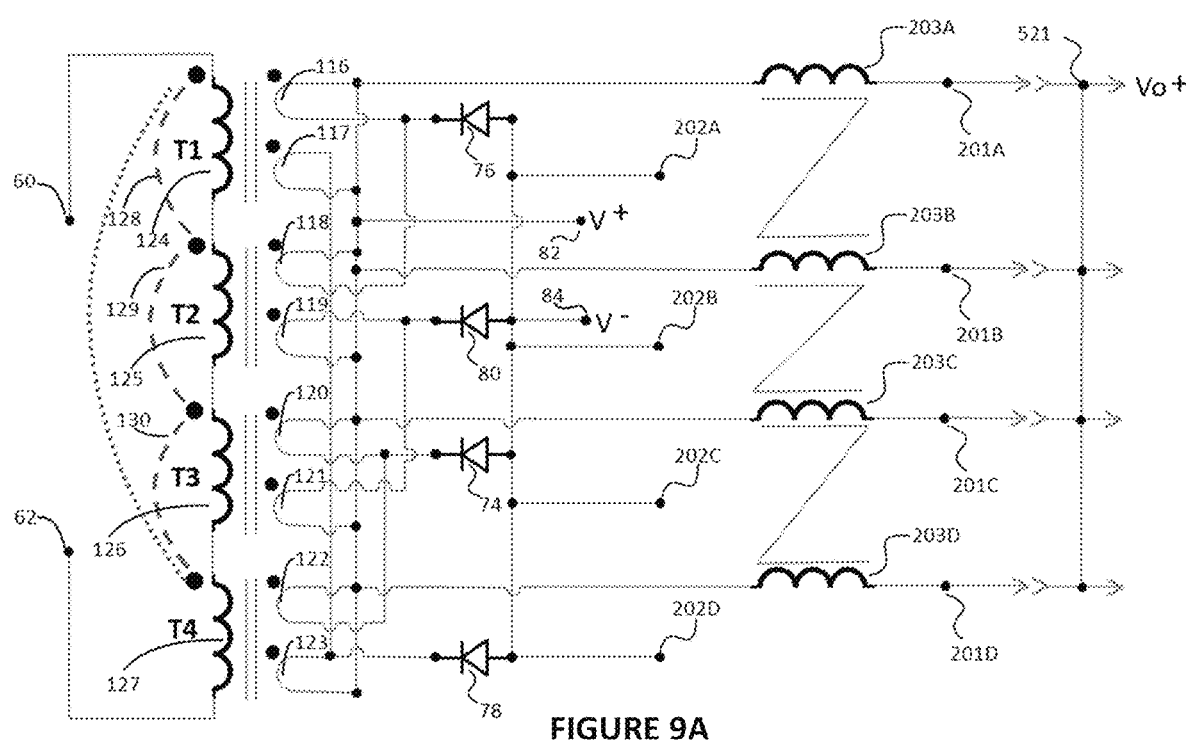
FIG. 9A: Shows our equivalent schematic of the embodiment wherein we introduce a novel implementation for the output inductor.
Figure 9B:
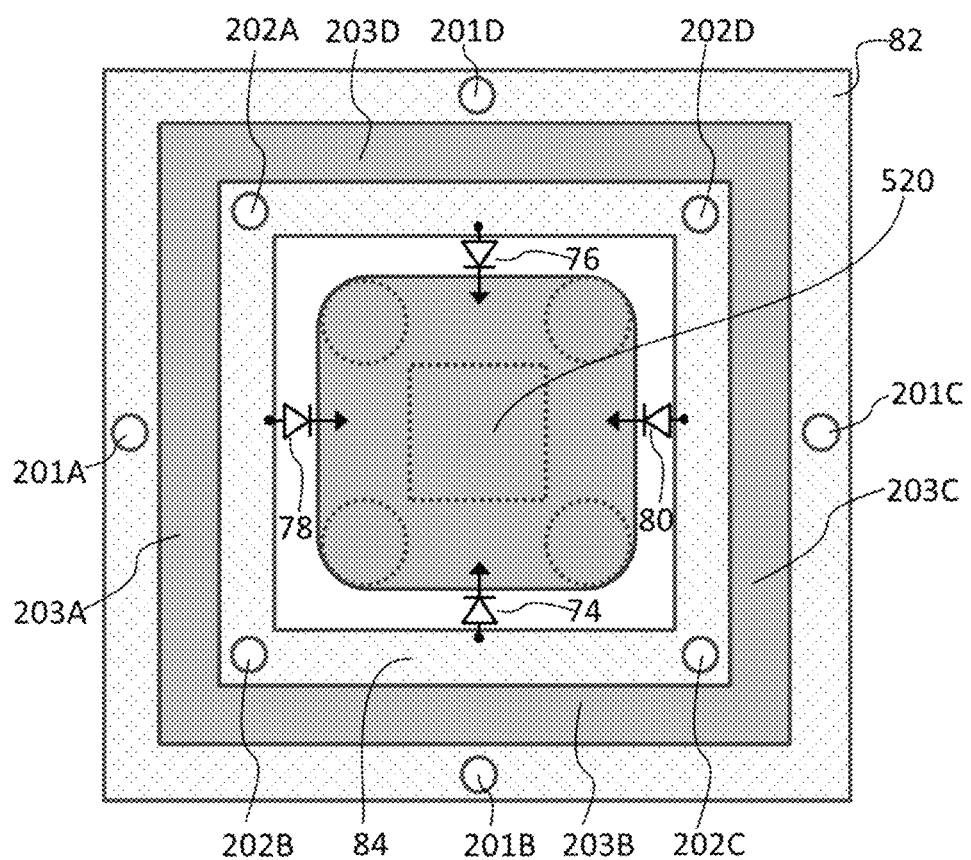
FIG. 9B: Shows an implementation of the four-legged magnetics structure from FIG. 9A together with a novel output inductor.

In FIG. 9A and FIG. 9B is presented another embodiment of this invention wherein there is a unique implementation of the output inductor. The entire four-legged magnetic structure, 520 which can be implemented in one of the configuration described in FIG. 5B, 7A, 7B or 8A, 8B or any other structure. The rectifier means 76, 74, 80 and 78 are rectifying the AC voltage injected in the primary winding. There are four pins, 202A, 202B, 202C and 202D, which are connected to the V−, 84. There are also four pins 201A, 201B, 201C and 201D whish are connected to V+, 82 as presented in FIG. 9A. There is a magnetic core composed by four sections 203A, 203B, 203C and 203D, which connected together. The entire structure can be formed by one magnetic core or four independent sections placed together. The current flowing towards 201A, 201B, 201C and 201D will flow under the magnetic core. The pins, 201A, 201B, 201C and 201D are connected further to the motherboard where they will form Vo+, 521. The pins connected to the V−84, 202A, 202B, 202C and 202D are also connected to the motherboard. The implementation of the output choke using a continuous peace of ferrite material, which does not perforate the multiplayer PCB, 82 it, is unique. In this embodiment we split the output current and by connecting the V−, 84 pins, 202A, 202B,202C and 202C and V+,201A, 201B,201C and 201C pins to the mother board we create turns around the magnetic core formed by 203A,203B,203C and 203D. This embodiment is very suitable for very high current application where we reduce the current applied to each pins by a factor of four in this particular implementation. In the case, if we use more than four legs transformer, for example N legged transformer then we can split the current in N section and use N pins to connect to the motherboard the V+ and N pins to connect to V−. The arrow placed in the cathode of the rectifier means 76, 80, 74 and 78, in FIG. 9B symbolizes the connection to the winding structure of the four legged transformer as presented in FIGS. 5B, 7A and 7B and 8A and 8B.

Figure 11:
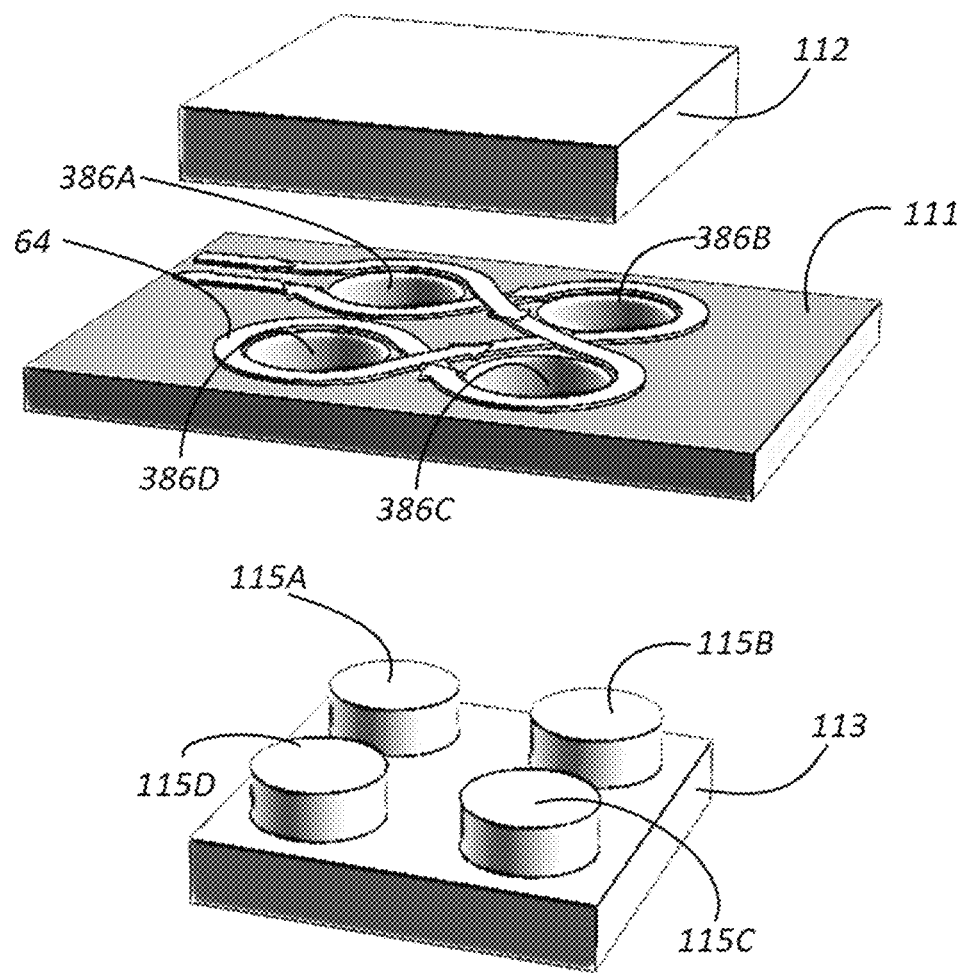
FIG. 11: Shows three-dimensional drawing of the four-legged magnetic structure wherein the cutout in the upper and lower plate is removed.

In FIG. 10 presented is the four-legged magnetic configuration. The primary and secondary windings of the transformer are implemented on the multilayer PCB, 111. There is a four legged magnetic core formed by a magnetic plate 113 and four cylindrical posts, 115A, 115B, 115C and 115D. There is a cutout 114B in the plate 113. The four cylindrical posts penetrate through the holes 386A, 386B, 386C and 386D. A plate 112 with a cutout 114A is placed on top making contact with the cylindrical posts directly or using an interface gap. In FIG. 11 is presented the same structure with the difference that the cutout 114A and 114 B is eliminated. There is not a magnetic flux through that cutout but for simplicity of the implementation in case of industrialization, the cutouts can be eliminated.

Figure 12:
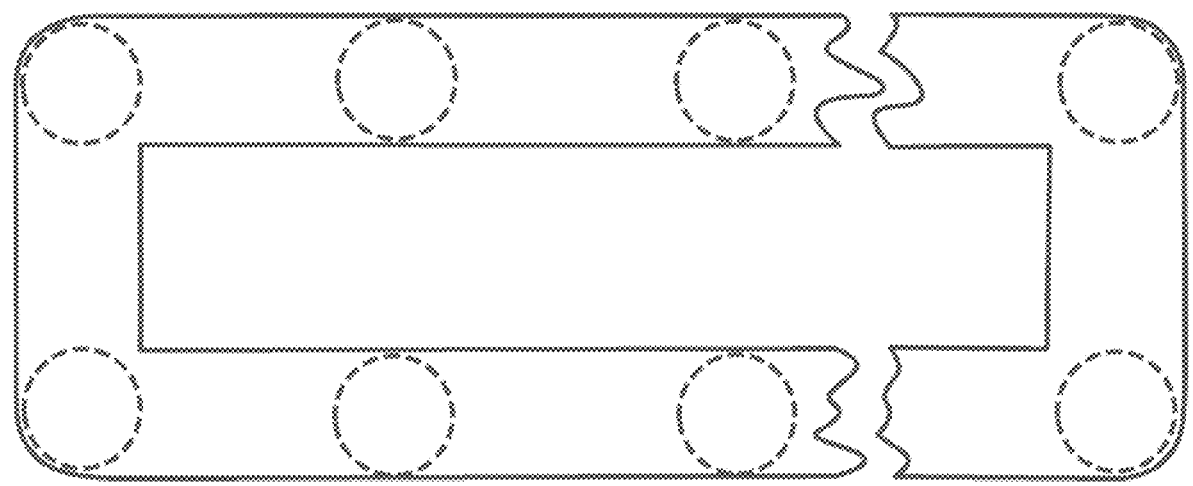
FIG. 12: Shows a potential implementation of the multi legged magnetic structure
Figure 13:
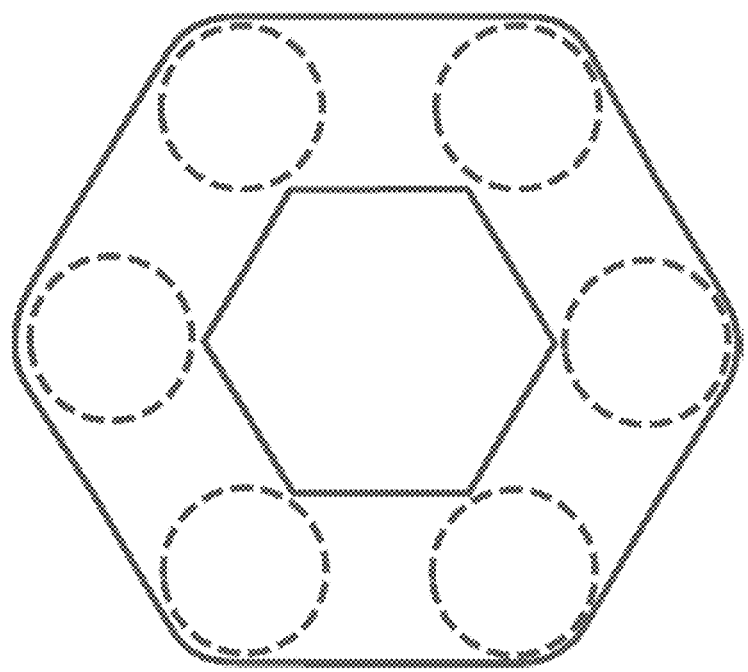
FIG. 13: Shows another potential implementation of the multi legged magnetic structure.

In FIG. 12 is presented another arrangement of this multi-legged magnetic structure in a rectangular shape having a multitude of legs. There can be many shapes we can implement this structure, one of them is presented in FIG. 13. Each magnetic structure starting with the two legged transformer, four-legged transformer and generally N legged transformer can be multiplied and each section can share the same primary winding. They will form power-processing cells and if they share the same primary winding, the leakage inductance between the primary winding and the secondary winding can be further reduced. The multi-legged magnetic structures can be used as transformers or can be used as inductors. In the inductor implementation the gap can be placed on top of each cylindrical leg and create a very efficient distributed gap minimizing in this way the gap effect.

Figure 14:
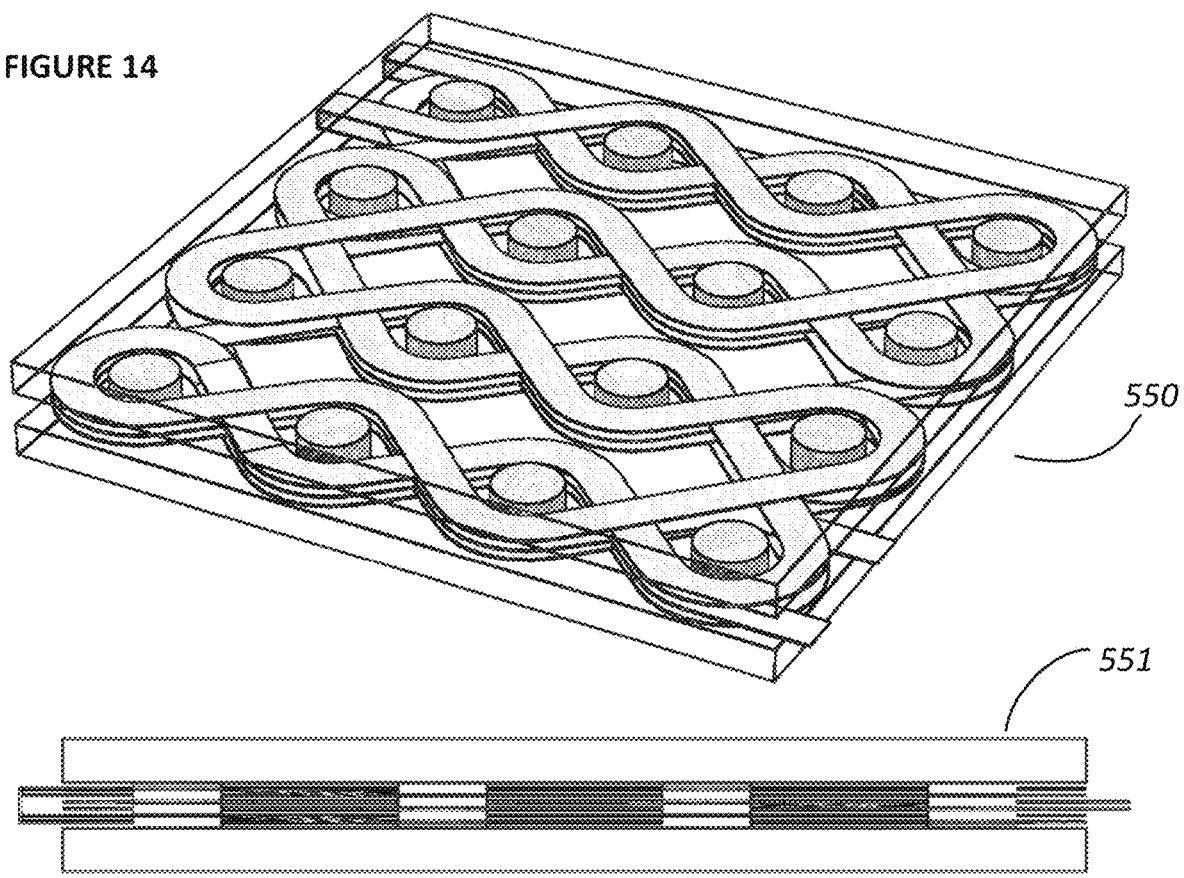
FIG. 14: Shows an implementation of the multi-legged magnetic structure employing ferrite material for the posts and the horizontal plates.

In FIG. 14 is presented a general multi-legged magnetic structure. The windings are implemented in a multiplayer structure which can be embedded also in a multilayer PCB and there are cylindrical magnetic posts and two magnetic plates, one on top and one on the bottom, as depicted in 550 and 551.

Figure 15:
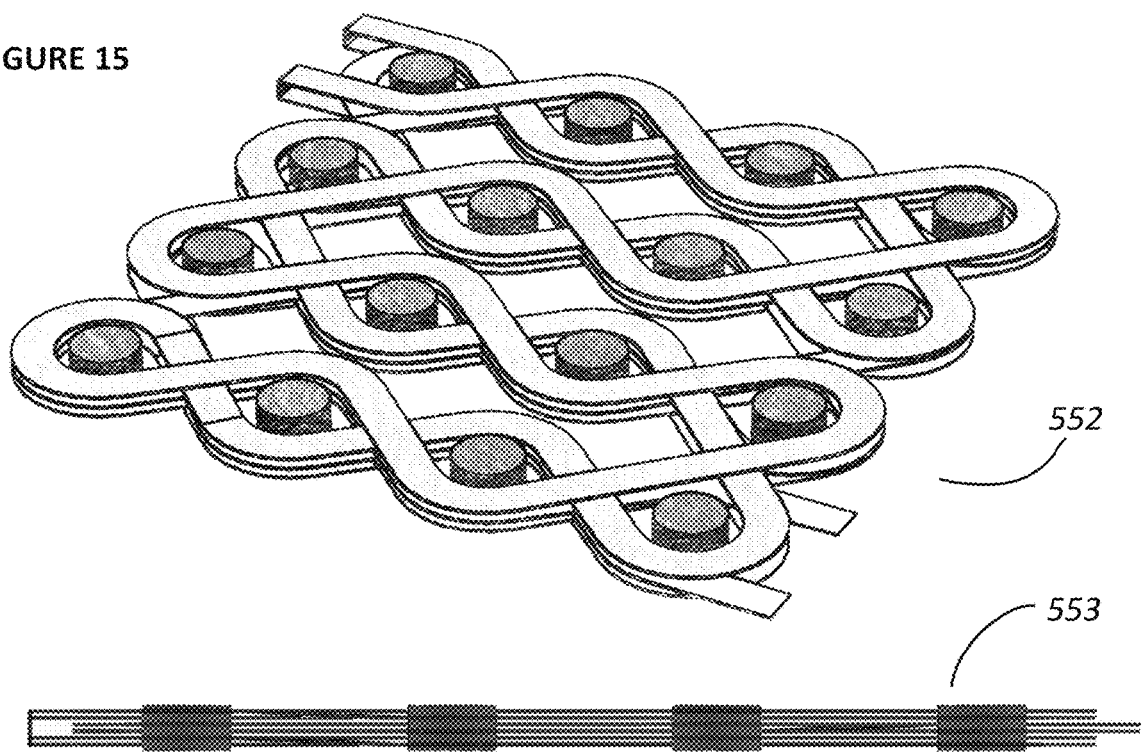
FIG. 15: Shows an implementation of the multi-legged magnetic structure employing ferrite material for the posts and without horizontal plates.

In FIG. 15 is presented an implementation wherein the windings are placed in multilayer structure, which can be a multilayer PCB and the magnetic cylindrical post without the ferrite plates on top and bottom, as depicted in 552 and 553.

Figure 16:
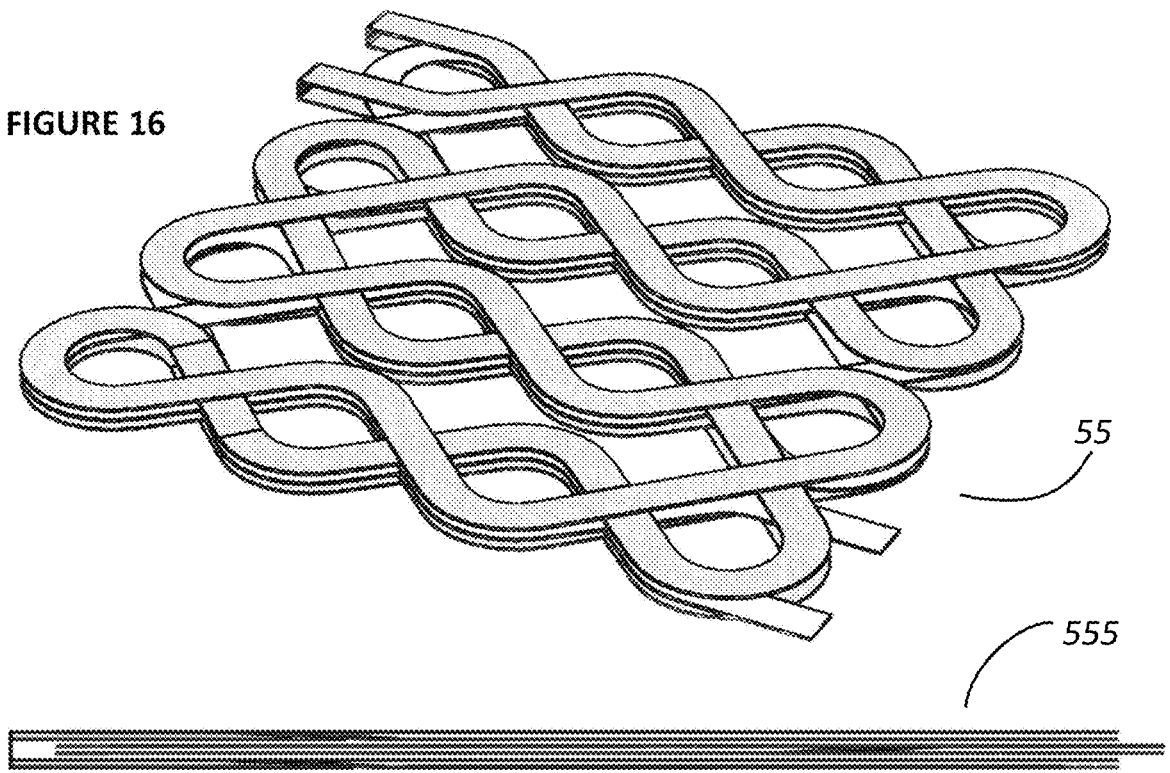
FIG. 16: Shows an implementation of the multi-legged magnetic structure without any magnetic material.

In FIG. 16 is presented an air core structure wherein the magnetic core material is totally removed and the windings are implemented in a multiplayer structure, which can be multilayer PCB. Such an air core structure has many advantages one of them being much lower AC losses in the winding at high frequency.

Figure 17:
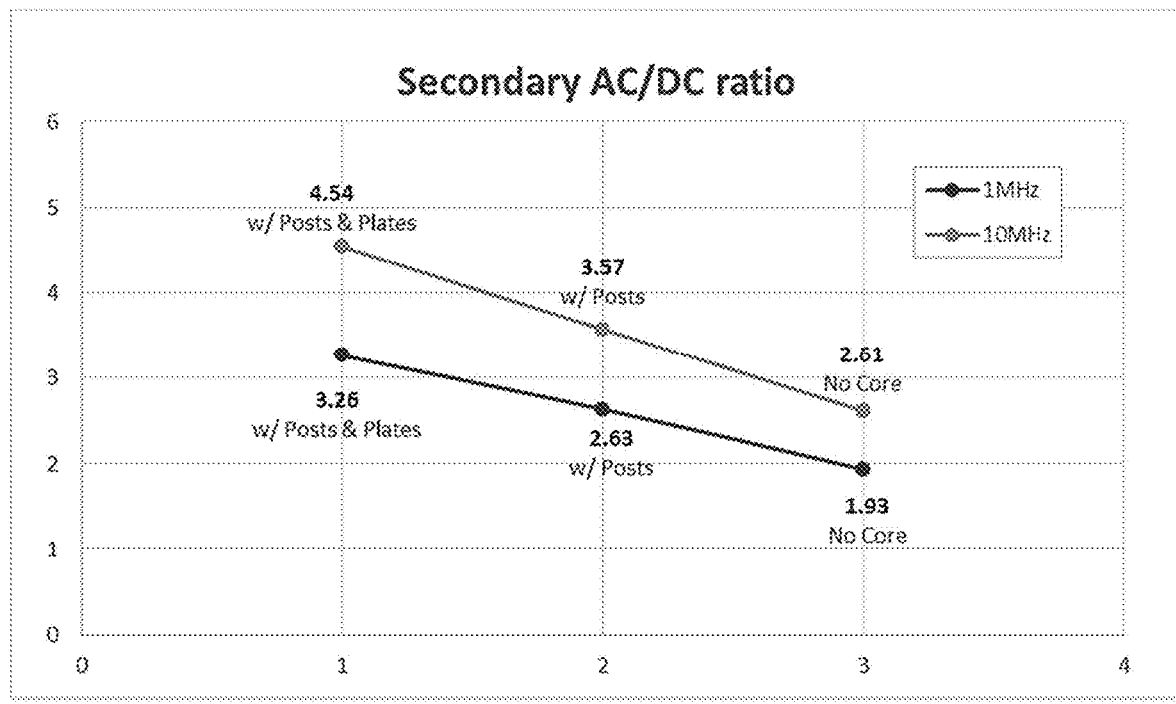
FIG. 17: Shows ratio AC/DC in the secondary winding for the magnetic structures presented in FIG. 14, FIG. 15 and FIG. 16.

In FIG. 17 is presented the simulate losses in such structures at 1 Mhz and 10 Mhz using posts and plates of magnetic material, just the magnetic posts of magnetic material and without any magnetic material.

The major advantage of these magnetic structures, especially for the air core implementation is the fact that the magnetic flux does weave from a loop to another reducing significantly the radiation. This magnetic structure with air core described in 554 contains the magnetic field, and forces it to be parallel with the winding, and it is very suitable for magnetic configuration without magnetic core. In addition to this has a low ac loss for very high frequency application wherein this structure may be used. This magnetic structure will allow power conversion at very high frequency in the range of tens of MHz with high efficiency.

The invention claimed is:

1. A magnetic circuit element that includes:
magnetic-flux-conducting posts, wherein the posts define a set;
a multi-layer structure formed with an electrically-conductive material, said multi-layer structure including multiple layers forming a stack of layers along a length of the posts, said multi-layer structure configured as primary and secondary windings of a transformer;
wherein at least two of the multiple layers each include a continuous ring of the electrically-conductive material, thereby defining at least first and second continuous rings in the multi-layer structure, and each of the first and second continuous rings continuously and fully encircles the set of posts;
the magnetic-flux-conducting posts are interposed between magnetic-flux-conductive plates;
one of the primary and secondary windings comprises a semiconductor component which is connected to the first ring of the electrically-conductive material;
the first and second rings are on different layers;
a magnetic-flux-conductive material is on top of the multi-layer structure and encircles the set of posts;
a first set of pins is connected to the first ring of the electrically-conductive material and is encircled by the magnetic-flux-conductive material;
a second set of pins is connected to the second ring of the electrically-conductive material and encircles the magnetic-flux-conductive material; and
the first and second set of pins are connected to a motherboard.

2. The magnetic circuit element of claim 1, wherein:
the one of the primary and secondary windings is connected to the second ring of the electrically-conductive material.

3. The magnetic circuit element of claim 2, wherein at least one of the first and second rings extends around the set of posts to allow a lowest impedance path to form for a current induced by the other of the primary and secondary windings to travel across.

4. The magnetic circuit element of claim 2, wherein the semiconductor component is located between two of the posts.

5. A magnetic circuit element that includes:
magnetic-flux-conducting posts, wherein the posts define a set;
a multi-layer structure formed with an electrically-conductive material, said multi-layer structure including multiple layers forming a stack of layers along a length of the posts, said multi-layer structure configured as primary and secondary windings of a transformer;
wherein at least two of the multiple layers each include a continuous ring of the electrically-conductive material, thereby defining at least first and second continuous rings in the multi-layer structure, and each of the first and second continuous rings continuously and fully encircles the set of posts;
the magnetic-flux-conducting posts are interposed between magnetic-flux-conductive plates;
one of the primary and secondary windings comprises a first semiconductor component which is connected to the first ring of the electrically-conductive material;

said one of the primary and secondary windings is connected to a second semiconductor component which is connected to the second ring of the electrically-conductive material;

a magnetic-flux-conductive material is on top of the multi-layer structure and encircles the set of posts;

a first set of pins is connected to the first ring of the electrically-conductive material and is encircled by the magnetic-flux-conductive material;

a second set of pins is connected to the second ring of the electrically-conductive material and encircles the magnetic-flux-conductive material; and the first and second set of pins are connected to a motherboard.

6. The magnetic circuit element of claim 5, wherein the first and second rings are on different layers.

7. The magnetic circuit element of claim 5, wherein at least one of the first and second rings extends around the posts to allow a lowest impedance path to form for a current induced by the other of the primary and secondary windings to travel across.

8. The magnetic circuit element of claim 5, wherein at least one of the first and second semiconductor components is located between two of the posts.

* * * * *